United States Patent [19]

Lundergan

[11] Patent Number: 4,470,650
[45] Date of Patent: Sep. 11, 1984

[54] DUAL-IN-LINE PLUG AND SOCKET ASSEMBLIES

[75] Inventor: Robert G. Lundergan, Camp Hill, Pa.

[73] Assignee: AMP Incorporated, Harrisburg, Pa.

[21] Appl. No.: 449,306

[22] Filed: Dec. 13, 1982

[51] Int. Cl.³ .................. H05K 1/18; H01R 13/627
[52] U.S. Cl. .................... 339/17 CF; 339/75 MP; 339/176 MP; 339/91 R
[58] Field of Search ........... 339/17 CF, 17 C, 75 MP, 339/75 M, 95 R, 95 D, 176 M, 176 MP, 91 R

[56] References Cited

U.S. PATENT DOCUMENTS

| | | | |
|---|---|---|---|
| 2,857,577 | 10/1958 | Vanderpool | 339/17 |
| 3,329,926 | 7/1967 | Aksu et al. | 339/176 |
| 3,474,387 | 10/1969 | Krum et al. | 339/75 |
| 3,753,211 | 8/1973 | Pauza et al. | 339/75 MP |
| 3,883,207 | 5/1975 | Tomkiewicz | 339/75 M |
| 3,951,491 | 4/1976 | Mysiak | 339/176 MP |
| 3,993,381 | 11/1976 | Horbach | 339/176 MP |
| 4,008,938 | 2/1977 | Anhalt et al. | 339/17 CF |
| 4,052,117 | 10/1977 | Tengler et al. | 339/17 CF |
| 4,189,199 | 2/1980 | Grau | 339/75 MP |
| 4,266,840 | 5/1981 | Seidler | 339/75 M |
| 4,349,238 | 9/1982 | Showman et al. | 339/75 M |
| 4,354,718 | 10/1982 | Buzht et al. | 339/17 CF |
| 4,391,408 | 7/1983 | Hanlon et al. | 339/17 CF |

OTHER PUBLICATIONS

Morgan et al, Joining DIP Modules to Printed Circuit Cards; 12–1962; IBM Bulletin, vol. 11, #7.

Primary Examiner—Joseph H. McGlynn
Assistant Examiner—Paula Austin
Attorney, Agent, or Firm—Robert W. J. Usher

[57] ABSTRACT

A dual-in-line plug and socket assembly in which the socket assembly has spaced rows of contact arms and opposed side walls comprising a series of barriers located between respective contact arms, profiles of the barriers extending transversely beyond the contact arms in lateral directions to protect the contact arms. The plug assembly includes a series of ramp surfaces located adjacent a component body supporting portion and arranged to interdigitate with the barriers and to urge the contact arms against contact legs of the component during mating the plug and socket assembly.

6 Claims, 7 Drawing Figures

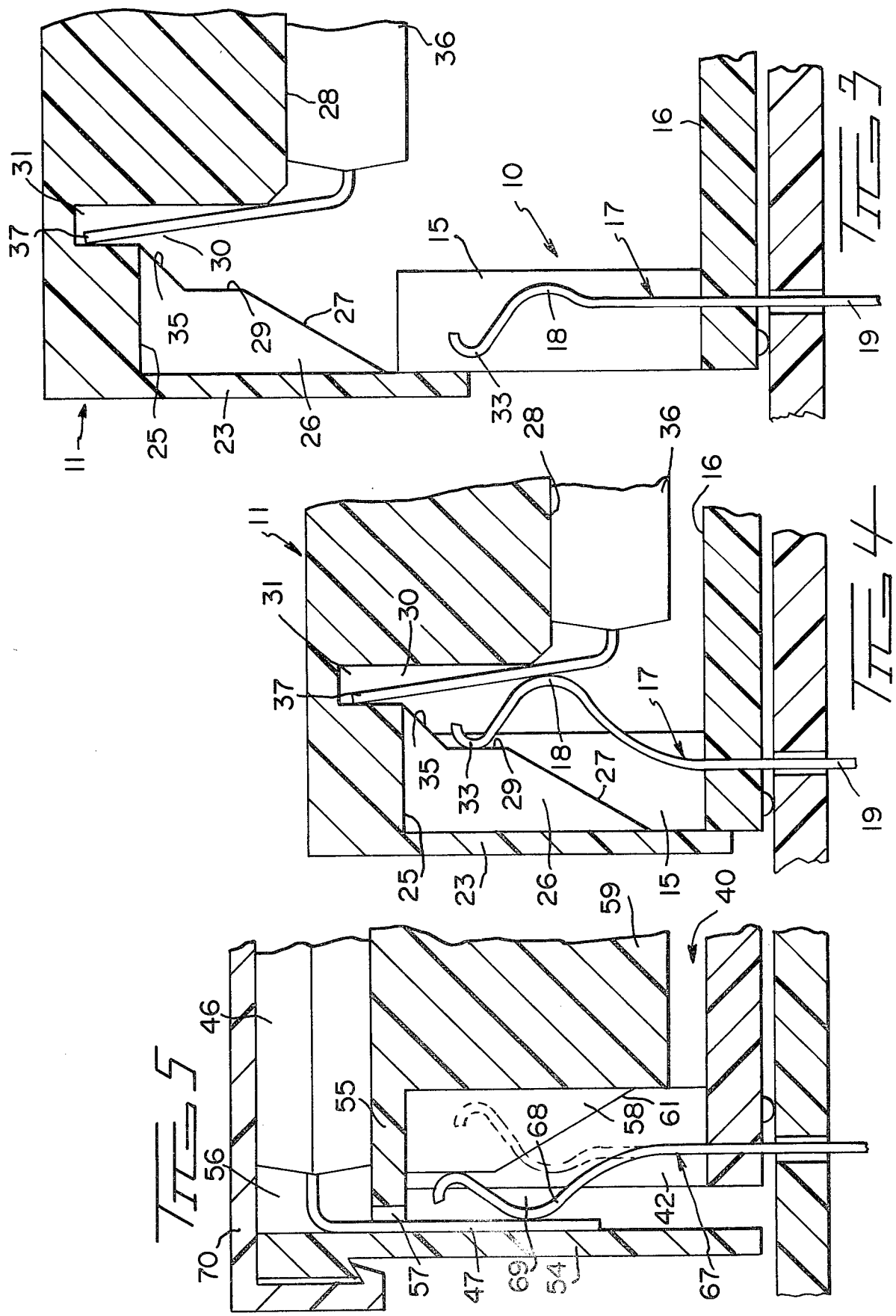

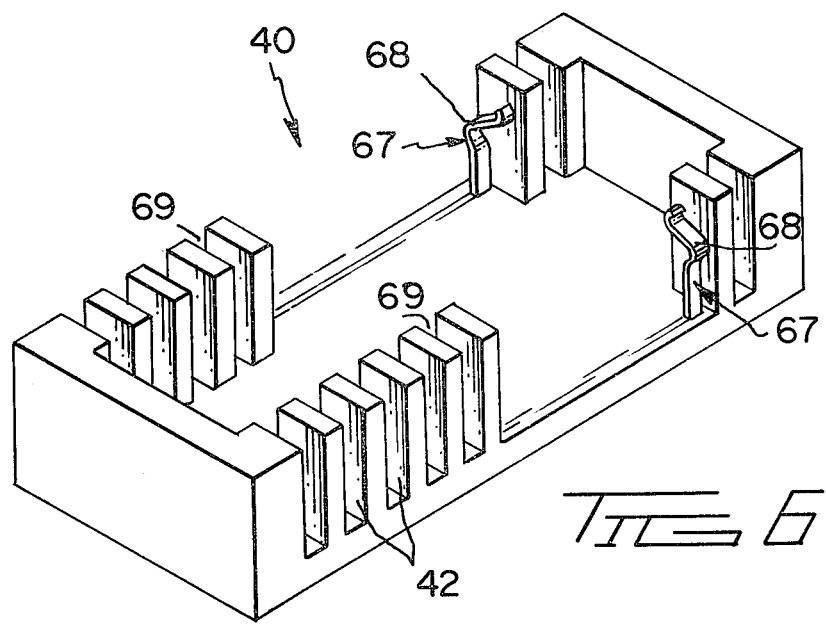
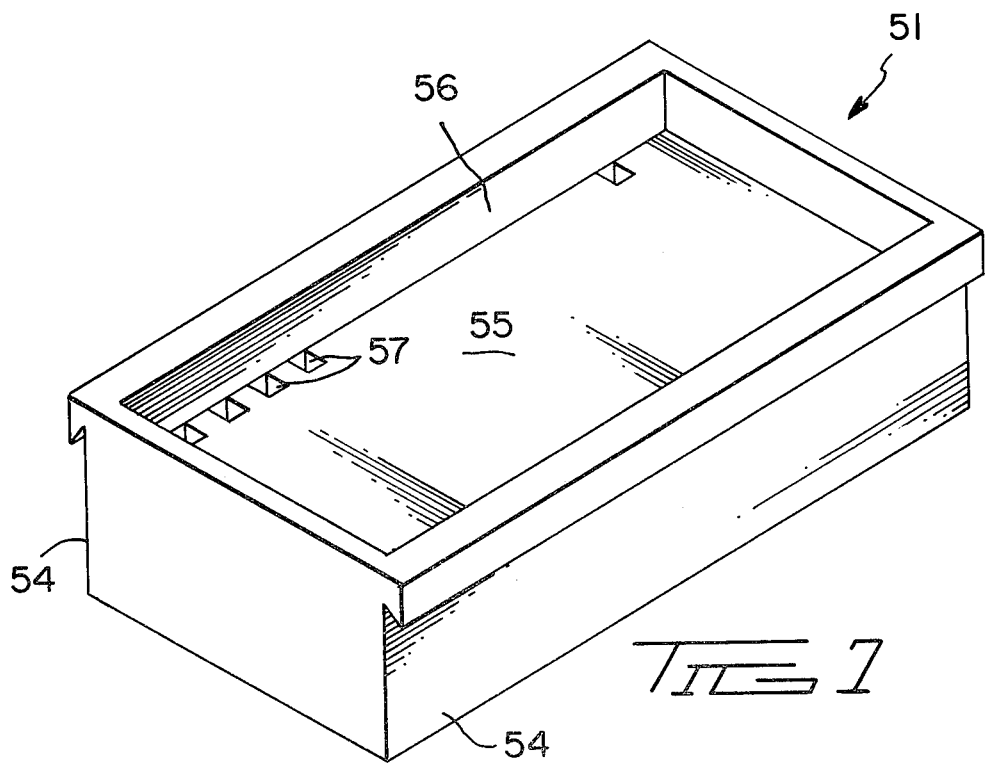

DUAL-IN-LINE PLUG AND SOCKET ASSEMBLIES

The invention relates to dual-in-line plug and socket assemblies for printed circuit boards.

In a known dual-in-line plug and socket assembly, the socket comprises a housing of insulating material having opposite side walls along which are located two laterally spaced rows of spring contact arms integral with posts extending below the housing side walls for anchoring in a printed circuit board. The plug assembly comprises a housing for a circuit component (usually, an integrated circuit chip) having two rows of contact legs arranged to engage the contact arms on mating with the socket assembly.

In some applications, for example, electronic games, it is necessary frequently to remove and reinsert plug assemblies manually to permit repeated reprogramming of a master unit to enable different games to be played.

It is important, therefore, that the plug assemblies be readily mateable and unmateable with the socket assembly without the need for a tool. The plug legs are relatively fragile and difficult to align manually with the socket contacts and, particularly when mated with free ends leading, particularly subject to strain, distortion and breakage.

Accordingly, it has been proposed to mount the integrated circuit chip in a carrier in which the legs are bent around the carrier body to support the legs and avoid projecting free ends.

However, a further requirement with programmed integrated circuit chips is to protect the legs from contact with the users hand as electrical discharges therewith, may not only alter the state of the charge storage devices in the integrated circuit, but destroy the integrated circuit chip. At the same time, the plug carrier must be inexpensive.

Similar protective requirements apply to the socket assembly as the user's fingers may touch exposed contact arms of the socket during attempts to insert or remove the plug assembly.

According to the invention, the side walls of the socket each comprise a series of closely spaced barriers between respective contact arms and having profiles extending transversely beyond the peripheries of the contact arms in all lateral directions, the plug assembly including a series of ramp surfaces located outside the contact walls and legs for interdigitation with the barriers progressively to engage respective contact arms on mating to cam the contact arms laterally beyond the profiles of the barriers into engagement with the contact legs of the circuit component.

The barrier walls protect the contact arms from inadvertent manual engagement with the user's fingers both prior and during mating with the plug contact. In addition, the contacts can only be brought into engagement when the ramp surfaces are accurately aligned between the barrier walls which further guide the ramp surfaces and legs throughout mating avoiding damage arising from contact leg misalignment.

As the ramp surfaces are located outside the contact arms, protection of the contact arms after mating is also assured. It is preferred that the ramp surfaces in respective rows are integrally joined by a continuous side wall portion so that, on mating, the side wall portions surround the barriers and contact arms completely to enclose the socket.

More specifically, the plug housing has a component body supporting portion upstanding from a base wall, narrow recesses being defined on respective opposite sides thereof between the ramp surfaces and the supporting portion, for receiving the legs with free ends directed towards the base wall. It is also preferred that the plug housing includes end walls joining respective side walls and integrally formed with resilient latches arranged the secure the chip body on the supporting portion in a snap fit.

According to another aspect of the invention, there is provided a dual-in-line plug and socket assembly in which the socket comprises a housing of insulating material, having opposite side walls along which are located two laterally spaced rows of spring contact arms, the side walls comprising a row of barriers located between respective contact arms and extending beyond the peripheries of the contact arms in lateral planes, the plug assembly comprising a housing for carrying a circuit component having two laterally spaced rows of contact legs arranged at equal pitch to the contact arms, the plug contact legs arranged at equal pitch to the contact armss, the plug housing having opposite side walls with inner contact supporting surfaces and two spaced rows of ramp surfaces laterally spaced within the side walls and defining therewith narrow contact leg and contact arm receiving recesses, the ramp surfaces being located for interdigitation with the barriers progressively to engage respective contact arms during mating of the plug and socket assembly to flex the contact arms outwardly beyond the profiles of the barriers into engagement with the contact legs of the circuit component.

Examples of dual-in-line plug and socket assemblies according to the invention, will now be described with reference to the accompanying drawings in which:

FIG. 3 is a fragmentary cross-sectional view of one side of the first example of plug and socket assembly aligned for mating;

FIG. 4 is a similar view to FIG. 3, after mating;

FIG. 5 is a fragmentary cross-sectional view of a second example of plug and socket assembly after mating;

FIG. 6 is an isometric view of a second example of socket assembly; and,

FIG. 7 is a isometric view of the second example of plug housing.

Figure 1:
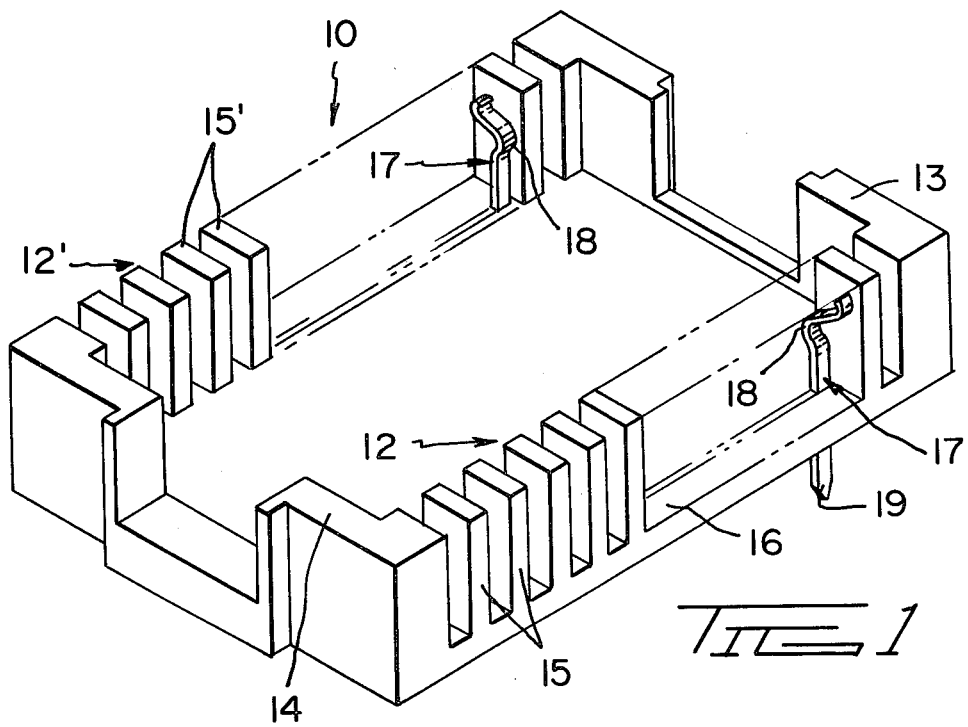
FIG. 1 is an isometric view of a first example of socket assembly.

As shown more particularly in FIG. 1, the socket housing 10 of the first example is moulded in one piece of plastics material and comprises a pair of spaced, opposed, parallel side walls 12 and 12' interconnected by end walls 13 and 14 to provide a rectangular box structure. The side walls 12 and 12' each comprise a series of closely spaced barriers 15 and 15' joined at lower ends by a base 16. A series of stamped and formed contacts 17 having upstanding, inwardly bowed, spring arms 18 integral with posts 19 extending through the base 16 are located between respective barriers. The profiles of the barriers 15 extend transversely beyond the peripheries of the contact arms in all lateral directions, as illustrated in the drawings.

Figure 2:
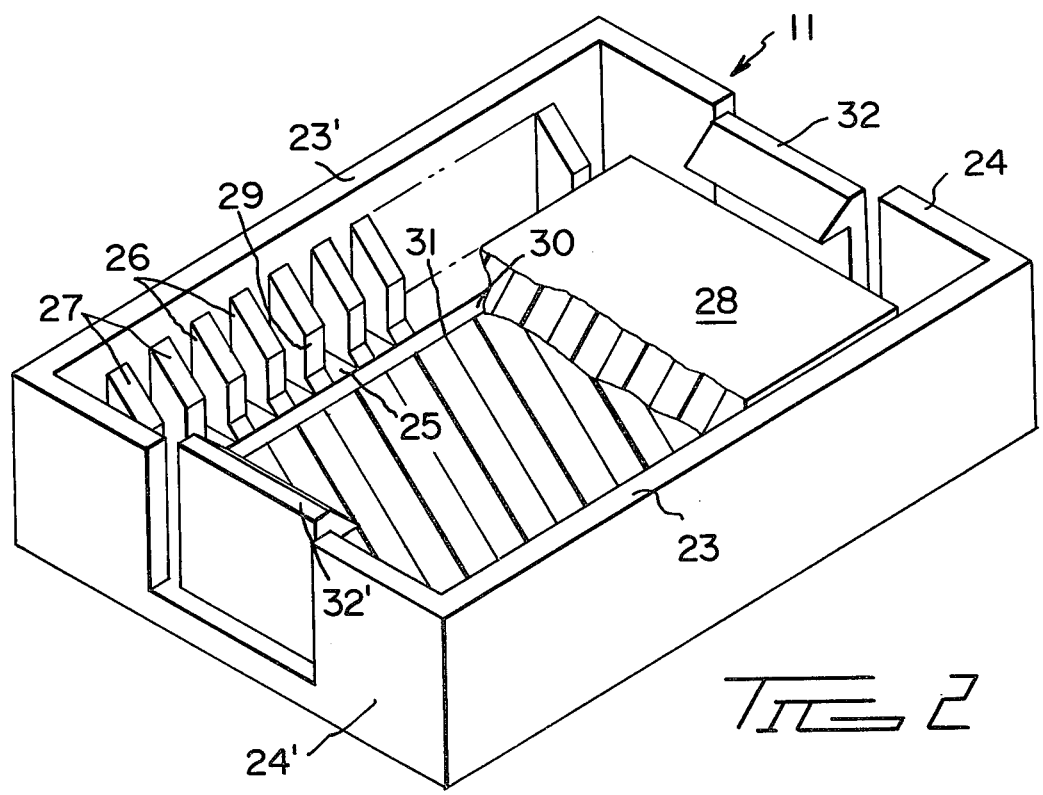
FIG. 2 is an isometric view of a first example of plug housing of the assembly.

As shown in FIG. 2, the plug housing 11 is moulded in one piece of plastics material and comprises spaced opposed side walls 23 and 23' interconnected by end walls 24 and 24' and a base wall 25 to define with the side walls a channel section. Two rows of ramps 26 extend inwardly in spaced apart relation along each side wall having inclined ramp surfaces 27 adjacent an open top of the housing and flats 29 adjacent the base wall. The lateral spacing of the ramp rows is greater than the rows of contacts 17 so that the ramp surfaces are located outside the contact arms. An integrated circuit chip support 28 upstands centrally from the base wall which defines with the support a narrow recess 30 on respective opposite sides terminating in a groove 31 formed in the base wall. Resilient latches 32 and 32' are provided on each end wall for engagement with a body 36 of the chip in a snap action to clamp the chip inside the plug housing.

As shown in FIGS. 3 and 4, in use of the assembly, the socket contact legs are anchored in a printed circuit board and the body 36 of the integrated circuit chip clamped to the support 28 with the legs 37 extending into the recesses on opposite sides.

During mating the plug and socket assemblies, the ramps 26 are received between respective barriers and the ramp surfaces 27 engage the free ends 33 of the contact arms to flex the bowed portions inwardly, beyond the profiles of the barriers progressively into engagement with aligned legs 37 of the integrated circuit chip until the assemblies are fully mated as shown in FIG. 4.

The contact arms are effectively protected as they lie within the profiles of the barriers prior to mating and are surrounded both by outer edge portions of the barriers during mating and, ultimately, by the plug housing side walls 24.

The recesses 30 in the plug housing are narrow to prevent admission of a user's finger into contact with the legs of the integrated circuit chip prior to mating.

Both the plug and socket assemblies are relatively inexpensive to manufacture by mass production techniques.

A series of additional guiding ramp surfaces 35 can be provided between the flats and the base wall for possible engagement by the free ends of the contact legs during assembly to guide the contact legs into the grooves 31.

In an alternative example, the walls 24 can be omitted while the plug assembly retains the channel section as a result of the two series of ramps.

In another alternative example shown in FIG. 5, the socket housing 40 is of similar construction to the first example except that the rows 42 of barriers are less widely spaced so that they are located laterally within the contact legs 47 of an integrated circuit chip 46. An additional difference is that the contacts 67 have contact arm portions 68 bowed outwardly.

The plug housing 51 is of generally channel section having side walls 54 and a base wall 55. The base wall is recessed to provide a chip receiving pocket 56 extending between root ends of the side walls, contact leg receiving apertures 57 being formed along respective opposite sides of the recess.

Rows of ramps 58 extend along respective opposite sides of a central ramp supporting portion 59 which upstands from the base wall, the ramps having outwardly facing ramp surfaces 61. The lateral spacing of the rows of ramps is less than that of the rows of socket contacts 67. The ramps and the side walls 54 define between them contact arm receiving recesses 69 sufficiently narrow to prevent a finger being inserted between the portion 59 and the side wall 54 into contact with the contact legs 47.

Prior to mating, the body of chip 46 is located in the recess 56 with legs 47 extending through apertures 57 into recesses 69 in abutment with inner surfaces of the side walls 54. A resilient cover 70 which may be joined to the side wall 54 by an integral web hinge is then snap-fitted onto the recess 56 to secure the chip therein.

On mating the plug and socket assemblies, the ramp surfaces 61 engage the free ends of the contact arms urging the bowed portions 68 outwardly beyond the lateral profiles of the barriers into contact with the free ends of the contact legs 47 of the integrated circuit chip.

I claim:

1. A dual-in-line plug and socket assembly in which the socket comprises a housing of insulating material, having opposite side walls along which are located two laterally spaced rows of spring contact arms, the side walls comprising a row of barriers located between respective contact arms and extending beyond the peripheries of the contact arms in lateral planes, the plug assembly comprising a housing of channel section adapted to carry a circuit component having an elongate body from respective opposite edges of which extend two laterally spaced rows of contact legs and arranged at equal pitch to the contact arms, the housing having two spaced rows of ramp surfaces located outside the contact legs and contact arms and for interdigitation with the barriers progressively to engage respective contact arms during mating of the plug and socket assembly to flex the contact arms inwardly beyond the profiles of the barriers into engagement with the contact legs of the circuit component.

2. A dual-in-line plug and socket assembly according to claim 1 in which the ramp surfaces in respective rows, are integrally joined by a continuous side wall portion.

3. A dual-in-line plug and socket assembly according to claim 1 in which the plug housing has a chip body supporting portion upstanding from a base wall of the housing, narrow recesses being defined between the ramp surfaces and the chip body supporting portion for receiving contact legs with free ends adjacent the base wall.

4. A dual-in-line plug and socket assembly according to claim 3 in which the plug housing includes end walls joining respective side walls and integrally formed with resilient latches arranged to secure the body on the supporting portion in a snap fit.

5. A dual-in-line plug and socket assembly in which the socket comprises a housing of insulating material, having opposite side walls along which are located two laterally spaced rows of spring contact arms, the side walls comprising a row of barriers located between respective contact arms and extending beyond the peripheries of the contact arms in lateral planes, the plug assembly comprising a housing adapted to carry a circuit component having an elongate body from respective opposite edges of which extend two laterally spaced rows of contact legs arranged at equal pitch to the contact arms, the plug housing having opposite side walls with inner contact leg supporting surfaces and two spaced rows of ramp surfaces laterally spaced within the side walls and defining therewith narrow contact leg and contact arm receiving recesses, the ramp surfaces being located for interdigitation with the barriers progressively to engage respective contact arms during mating of the plug and socket assembly to flex the contact arms outwardly beyond the profiles of the barriers into engagement with the contact legs and the circuit component.

6. A dual-in-line plug and socket assembly according to claim 5 in which a base wall of the plug housing includes a component body supporting pocket extending between root ends of side walls, contact leg receiving apertures being formed along respective opposite sides of the recess in communication with the pocket and the recesses.

* * * * *